United States Patent
Yen

(10) Patent No.: US 6,927,992 B1
(45) Date of Patent: Aug. 9, 2005

(54) TRACE-IMPEDANCE MATCHING AT JUNCTIONS OF MULTI-LOAD SIGNAL TRACES TO ELIMINATE TERMINATION

(75) Inventor: Yao Tung Yen, Cupertino, CA (US)

(73) Assignee: Pericom Semiconductor Corp., San Jose, CA (US)

(*) Notice: Subject to any disclaimer, the term of this patent is extended or adjusted under 35 U.S.C. 154(b) by 0 days.

(21) Appl. No.: 10/707,249

(22) Filed: Dec. 1, 2003

Related U.S. Application Data

(63) Continuation-in-part of application No. 10/249,845, filed on May 12, 2003.

(51) Int. Cl.$^7$ .............................................. G11C 5/06
(52) U.S. Cl. ...................... 365/63; 365/185.27; 365/51
(58) Field of Search ............................. 365/63, 185.27, 365/51, 52, 129, 233; 710/100

(56) References Cited

U.S. PATENT DOCUMENTS

| | | | | |
|---|---|---|---|---|
| 4,578,652 A | * | 3/1986 | Sterns ........................ 333/117 |
| 5,260,892 A | | 11/1993 | Testa et al. .................... 365/63 |
| 5,426,405 A | | 6/1995 | Miller et al. ................. 333/247 |
| 5,532,954 A | | 7/1996 | Bechtolsheim et al. ....... 365/52 |
| 6,061,263 A | | 5/2000 | Boaz et al. .................... 365/51 |
| 6,067,594 A | | 5/2000 | Perino et al. ................ 710/310 |
| 6,078,965 A | * | 6/2000 | Mellitz et al. .................. 710/1 |
| 6,104,629 A | | 8/2000 | Wu .............................. 365/63 |
| 6,125,419 A | * | 9/2000 | Umemura et al. ........... 710/110 |
| 6,236,572 B1 | | 5/2001 | Teshome et al. ............ 361/764 |
| 6,381,164 B1 | * | 4/2002 | Fan et al. ...................... 365/51 |
| 6,437,660 B1 | * | 8/2002 | Sullivan ..................... 333/100 |
| 6,441,428 B1 | * | 8/2002 | Ghodsi ....................... 257/315 |
| 6,449,166 B1 | | 9/2002 | Sly et al. .................... 361/760 |
| 6,484,299 B1 | | 11/2002 | Larsen .......................... 716/6 |
| 6,487,086 B2 | | 11/2002 | Ikeda et al. ................. 361/772 |
| 6,515,555 B2 | | 2/2003 | Leddige et al. .............. 333/34 |
| 6,542,393 B1 | | 4/2003 | Chu et al. ..................... 365/51 |

* cited by examiner

*Primary Examiner*—Van Thu Nguyen
*Assistant Examiner*—Dang T. Nguyen
(74) *Attorney, Agent, or Firm*—Stuart T. Auvinen

(57) ABSTRACT

A module board has trace impedances that are matched at trace junctions. An input line that drives a signal to a junction has its impedance adjusted to match the equivalent impedance of branch traces output from the junction. Since input and output impedances match, reflections caused by the junction are minimized or eliminated. The input impedance can match by being within 20% of the equivalent impedance of the branch lines. The equivalent impedance of branches is the reciprocal of the sum of the individual branch lines' reciprocal impedance. Termination can be eliminated when such junctions are impedance-matched. Secondary junctions can also be impedance-matched, allowing for a variety of trace topologies. Such trace-impedance matching is especially useful for memory modules.

18 Claims, 11 Drawing Sheets

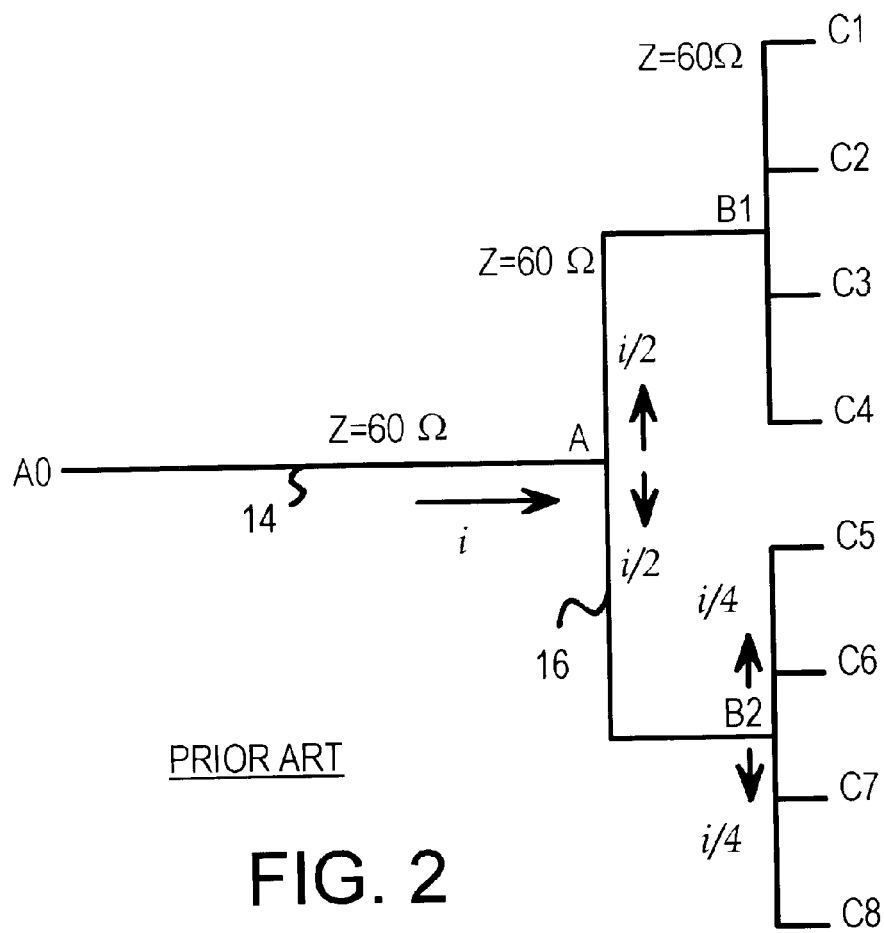
PRIOR ART
FIG. 2
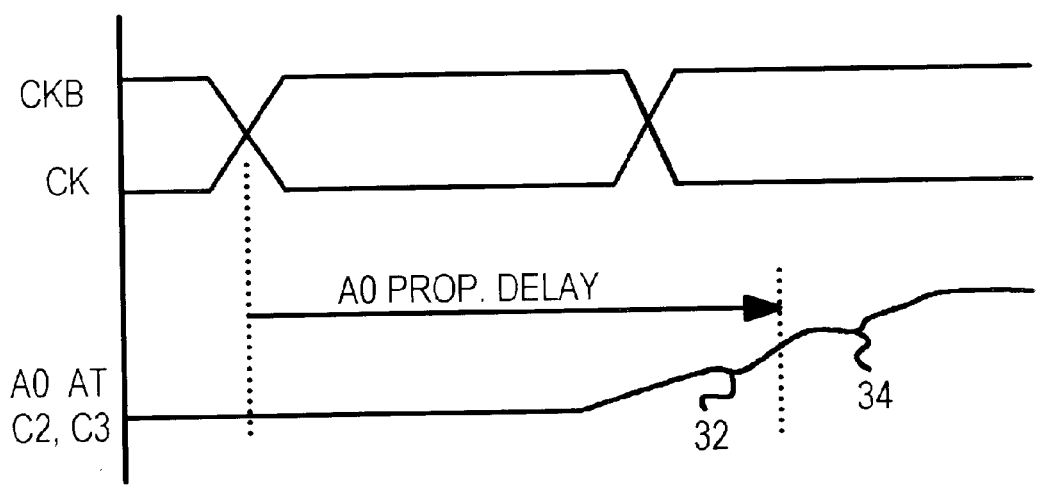
PRIOR ART    FIG. 3

TRACE-IMPEDANCE MATCHING AT JUNCTIONS OF MULTI-LOAD SIGNAL TRACES TO ELIMINATE TERMINATION

CROSS REFERENCE TO RELATED APPLICATIONS

This application is a continuation-in-part of the co-pending application for "DDR Memory Modules With Input Buffers Driving Split Traces with Trace-Impedance Matching at Trace Junctions", U.S. Ser. No. 10/249,845, filed May 12, 2003.

BACKGROUND OF INVENTION

This invention relates to memory modules, and more particularly to adjusting trace impedances on memory modules.

Personal computers (PCs) and other electronic systems often use memory modules such as dual-inline memory modules (DIMMs). Memory modules have memory chips such as dynamic-random-access memories (DRAMs) mounted on a small printed-circuit board (PCB) or other substrate. Contact pads along one edge of the substrate make electrical contact when the memory module is plugged into a socket such as on a PC motherboard.

As these electronic systems operate at higher and higher speeds, signals driven to the memory modules must also operate at higher frequencies. Faster high-current drivers can be used to more rapidly drive current to charge and discharge the capacitances on the inputs of DRAM chips on the memory modules. These DRAM-input capacitances can be significant, producing a large capacitive load on the inputs to the memory modules, especially when many DRAM chips are mounted on the same memory module.

Further compounding the input-capacitance problem is the use of expansion memory. A PC motherboard may contain several memory-module sockets such as 2 or 4. Initially, only one socket may be populated with a memory module, but later the end-user may insert additional memory modules into the unused memory-module sockets to expand the memory capacity.

FIG. 1 shows a signal trace on a typical memory module. Register 10 on a DIMM includes driver 12 that drives line 14. Line 14 is the address line A0, but could be other address or control lines generated by a memory controller on a PC motherboard.

Contact pads along an edge of DIMM 20 make electrical contact with metal tabs inside the memory module socket. Lines 14, 16 are wiring traces on or within the memory module board of DIMM 20.

DIMM 20 contains eight DRAM chips 21–28. Dram chips 21–28 can be synchronous DRAMs (SDRAMs) that receive a clock as one of the control lines. Some DIMM modules may have fewer or more DRAM chips than the 8 shown in this example.

The A0 address signal must be routed to inputs of all 8 DRAM chips 21–28. Line 14 is initially one trace, but then branches into two branches at junction A. One branch continues to junction B1, where it again splits, ultimately to four branches C1, C2, C3, C4 that connect to inputs of DRAM chips 21–24. The lower branch continues to junction B2, where it again splits, ultimately to four more branches C5, C6, C7, C8 that connect to inputs of DRAM chips 25–28.

FIG. 2 highlights a reflection problem caused by trace junctions. Line 14 has an impedance determined primarily by its width, thickness, and length, and proximity to other wiring traces and layers. Often minimum-width wiring traces are used for all signal traces on the memory module, although power and ground may use wider traces.

The input trace, line 14, using the minimum trace width, has a characteristic impedance of about 60 ohms. The branch from junction A to junction B1 also uses the minimum width, and also has an impedance of 60 ohms. The final stubs to the inputs of DRAM chips 21–28 are very short but usually have the same impedance, about 60 ohms.

When the output driver of the register drives the signal to the opposite state, the initial wave-front or surge of current i travels down line 14 toward junction A. At junction A, the current is split into two halves or roughly i/2 each. At junctions B1, B2, the current is again divided. Since wiring traces have the same impedance before and after junction A, the initial voltage from the initial wave-front traveling along the branch to B1 is half the voltage before junction A, since the voltage is=i*Z before junction A, and the voltage is=i/2*Z along each branch after junction A. If impedance Z before A and impedance Z after A are the same, then the voltage at the trace segment from A to B1 or B2 is one half of the voltage at A.

Of course, these are rough estimates, and actual impedances will not be exactly equal, and the voltage drop-off after junction A may not be exactly 50%. However, the general idea is that the instantaneous voltage of the initial wave-front drops off after junction A when the same-width and same-thickness wiring traces are used before and after the junction.

Further voltage reduction of that initial wave-front can occur at junctions B1, B2, and further reduce the initial voltage applied to the inputs to DRAM chips 21–28. Reflections can also occur at the junctions and from the chip inputs.

As higher frequencies are used, wiring traces act more like transmission lines. Reflections from junctions and chip inputs travel backward along the line after the initial wave-front reaches the junctions or chip inputs. These reflections disturb instantaneous voltages along the line, and take time to settle. This settling time can reduce the practical operating frequency.

Termination circuits such as resistors are normally added to trace endpoints on other systems, but memory modules are so small that such terminations are not desirable.

FIG. 3 is a timing diagram showing the problem of voltage drop-off at trace junctions on the memory module. The register output may drive signal A0 high in response to a rising edge of clock CK. After some delay from the clock, the driver drives an initial wave-front down the trace to the memory module. The voltage at the chip inputs C2, C3, . . . is shown. Voltage drop-offs at junctions A and B1 reduce the voltage of the initial wave-front, and cause reflections that reduce the voltage at C1, C2, such as knee 32 caused by junction A, and knee 34, caused by junction B1.

The delay until the voltage at DRAM inputs C2, C3 rises above the logic threshold is the propagation delay. This propagation delay is extended due to knee 32. The logic threshold of the DRAM input is not reached by the initial wave-front. Instead, the voltage rises above the logic threshold only after one or more reflection returns and then boost the voltage above the logic threshold.

The parent application disclosed a memory module with trace-impedance matching at trace junctions. FIG. 4 highlights the concept of impedance matching at a wiring-trace junction on a memory module. A register output signal, such as address A0 drives line 15. At junction A, input line 15 splits into two branches (lines 16) to secondary junctions B1, B2. Then the wiring traces split again to reach inputs C1–C8 of eight DRAM chips on the memory module.

The impedance mis-match at junction A is eliminated by adjusting the input impedance to match the output impedance. The impedance of input line 15 is adjusted to match the combination of the impedances of the two branches of lines 16. Lines 16 are typically minimum-width and minimum-thickness wiring traces on or within the memory module substrate and have a characteristic impedance of 60 ohms each. The combination of the two parallel 60-ohm impedances is 30 ohms (The equivalent impedance $Z=1/[(1/Z1)+(1/Z2)]$ where Z1 and Z2 are in parallel). Thus input line 15 is adjusted to have a 30-ohm impedance. This can be done by doubling the width of the wiring trace for input line 15 relative to the width of lines 16.

By matching the input impedance of line 15 to the combined output impedance of the two lines 16, impedance mis-match at junction A can be avoided. This improves signal integrity.

A larger driver may be needed to drive the reduced impedance of input line 15. With the larger driver driving input line 15 with a reduced impedance of 30 ohms, the current delivered to junction A from input line 15 by the initial wave-front is double the current delivered in FIG. 2 by the 60-ohm line 14.

This initial current 2i into junction A is split into two branches of lines 16, each receiving current i, about half the current entering junction A. The initial current in each branch is again split at junctions B1 and B2 into currents of i/2. This is double the i/4 current delivered in FIG. 2.

The doubled current delivered to the DRAM inputs produces a higher initial voltage rise at the inputs C1–C8 of the DRAM chips. This higher initial voltage rise can be above the logic threshold (such as 1.2 volts, or Vcc/2, or another intermediate value), allowing the switching point voltage to be reached on the initial wave-front before any knees due to reflections occur. Then the propagation time is not delayed due to settling time for reflections and ringing. The first reflection from junction A is eliminated when the impedance matching is exact, or reduced significantly even when the input and output impedances are not precisely matched.

The actual impedances of lines 16 may not be 60 ohm, but may be some other value. Likewise, input line 15 may not be exactly 30-ohm impedance, and there may be some impedance mis-match even when input line 15 is double the width of output lines 16, such as a mis-match of 10% or even 20%. However, the concepts of impedance matching at wiring junctions are best illustrated with this simplified example.

The length of each branch of lines 16 is 2.15 inches in one embodiment, and the length of the distribution lines after point B1, and after point B2, is about half, at 1 inch or so. Significant reflections can occur at junctions A and B1, B2.

The lengths of final stubs from the line after point B1 to DRAM inputs C1, C2 . . . C4 and from the line after point B2 to DRAM inputs C5, C6 . . . C8 are only 0.25 inch or so. Thus the reflections caused by the final stubs to the DRAM inputs is much less than the reflections caused by junctions A, B1, and B2.

Some memory modules have DRAM chips mounted in pairs on opposite surfaces of the module board. Other modules stack DRAM chips on top of each other in a piggy-back fashion. It is desirable to extend the trace-matching taught in the parent application to these memory modules with paired DRAMs. Other memory modules may have varying numbers of DRAM chips, and may have multi-way trace junctions, such as 3-way or 4-way junctions. It is desirous to extend the principals of impedance matching at junctions to various trace topologies.

Some DRAM's have differential inputs rather than single-ended inputs. For example, a clock may be differential, having two signal inputs to each DRAM chip. A terminating resistor may be placed between the two signal inputs to terminate the differential signals. However, this termination is undesirable. It is further desired to extend trace impedance-matching to differential signals. For these differential signals, it is desired to reach the differential cross-over point on the initial wave-front to reduce delays due to transmission-line effects.

BRIEF DESCRIPTION OF DRAWINGS

FIG. 2 highlights a reflection problem caused by trace junctions.

FIG. 3 is a timing diagram showing the problem of voltage drop-off at trace junctions on the memory module.

DETAILED DESCRIPTION

The present invention relates to an improvement in trace impedance-matching. The following description is presented to enable one of ordinary skill in the art to make and use the invention as provided in the context of a particular application and its requirements. Various modifications to the preferred embodiment will be apparent to those with skill in the art, an the general principles defined herein may be applied to other embodiments. Therefore, the present invention is not intended to be limited to the particular embodiments shown and described, but is to be accorded the widest scope consistent with the principles and novel features herein disclosed.

Figure 1:
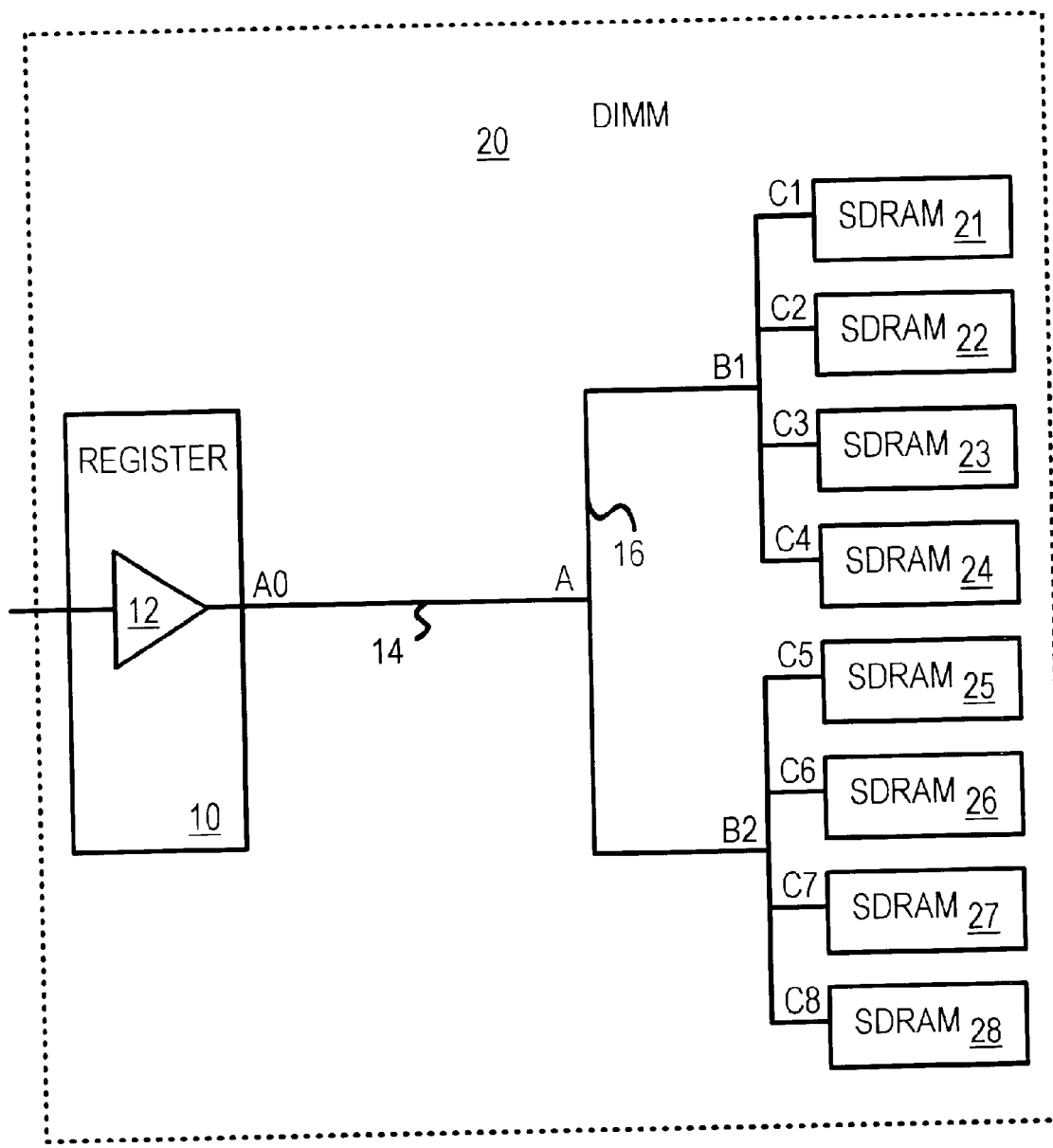
FIG. 1 shows a signal trace on a typical memory module.
Figure 4:
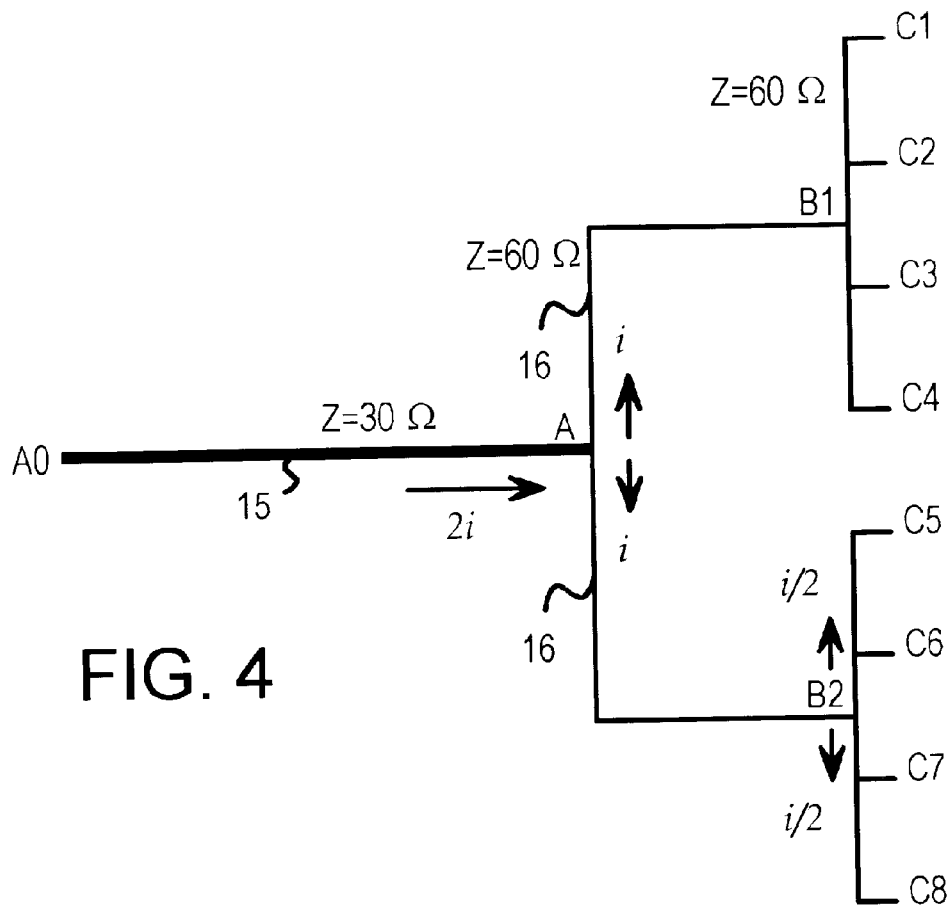
FIG. 4 highlights the concept of impedance matching at a wiring-trace junction on a memory module.
Figure 5:
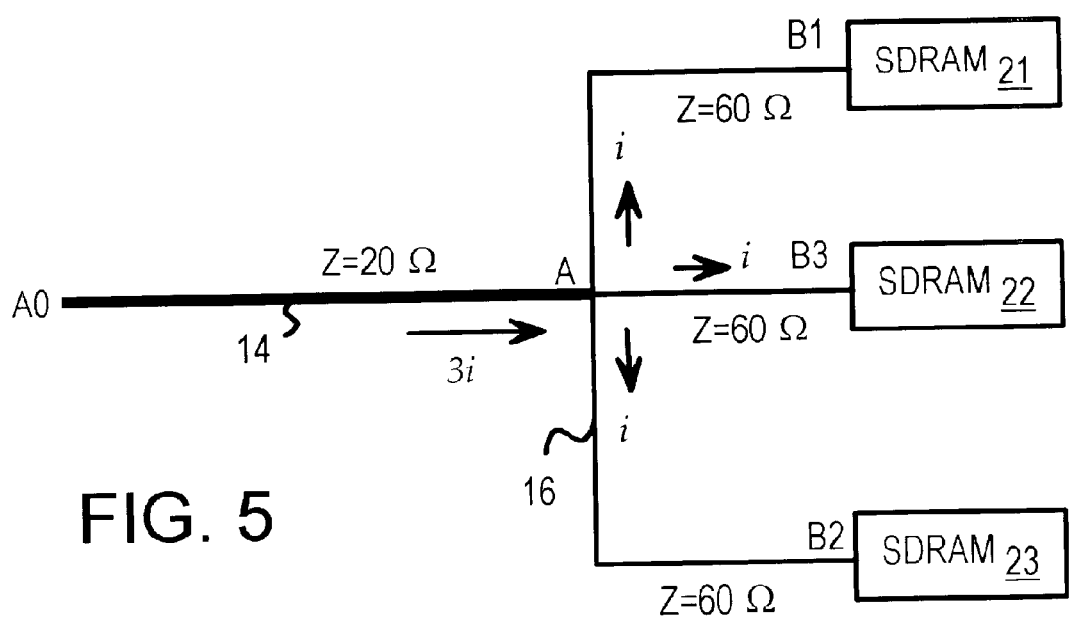
FIG. 5 shows impedance matching at a 3-way junction.

FIG. 5 shows impedance matching at a 3-way junction. An incoming signal, such as address A0 from output of register on a DIMM, drives line 14. At junction A, input line 14 splits into three branches (lines 16) to secondary junctions B1, B2, B3. Each of the 3 lines 16 reaches an input B1, B3, B2 of DRAM chips 21, 22, 23, respectively.

The impedance mis-match at junction A is eliminated by adjusting the input impedance to match the output impedance. The impedance of input line 14 is adjusted to match the combination of the impedances of the three branches of lines 16. Lines 16 are typically minimum-width and minimum-thickness wiring traces on or within the memory module substrate and have a characteristic impedance of 60 ohms each. The combination of the three parallel 60-ohm impedances is 20 ohms (The equivalent $Z=1/[(1/Z1)+(1/Z2)+(1/Z3)]$ where Z1, Z2, and Z3 are in parallel). Thus input line 14 is adjusted to have a 20-ohm impedance. This can be done by tripling the width of the wiring trace for input line 14 relative to the width of lines 16.

By matching the input impedance of line 14 to the combined output impedance of lines 16, impedance mis-match at junction A can be avoided. This improves signal integrity. A larger driver may be needed on the chip set or on the memory module to drive the reduced impedance of input line 14. With the larger driver driving input line 14 with a reduced impedance of 20 ohms, the current delivered to junction A from input line 14 by the initial wave-front is triple the current delivered in FIG. 2 by the 60-ohm line 14.

This initial current 3i into junction A is split into three branches of lines 16, each receiving current i, about one-third the current entering junction A.

The current i delivered to the DRAM inputs produces a higher initial voltage rise at the inputs B1, B3, B2 of DRAM chips 21, 22, 23. This higher initial voltage rise can be above the logic threshold (such as 1.2 volts, or Vcc/2, or another intermediate value), allowing the switching point voltage to be reached on the initial wave-front before any knees due to reflections occur. Then the propagation time is not delayed due to settling time for reflections and ringing. The first reflection from junction A is eliminated when the impedance matching is exact, or reduced significantly even when the input and output impedances are not precisely matched.

The actual impedances of lines 16 may not be 60 ohm, but may be some other value. Likewise, input line 14 may not be exactly 30-ohm impedance, and there may be some impedance mis-match even when input line 14 is double the width of output lines 16, such as a mis-match of 10% or even 20%. Thus rather than doubling the width of input line 14, some other ratio may be needed to match the output imped-ance when lengths differ. However, the concepts of imped-ance matching at wiring junctions are best illustrated with this simplified example.

Figure 6:
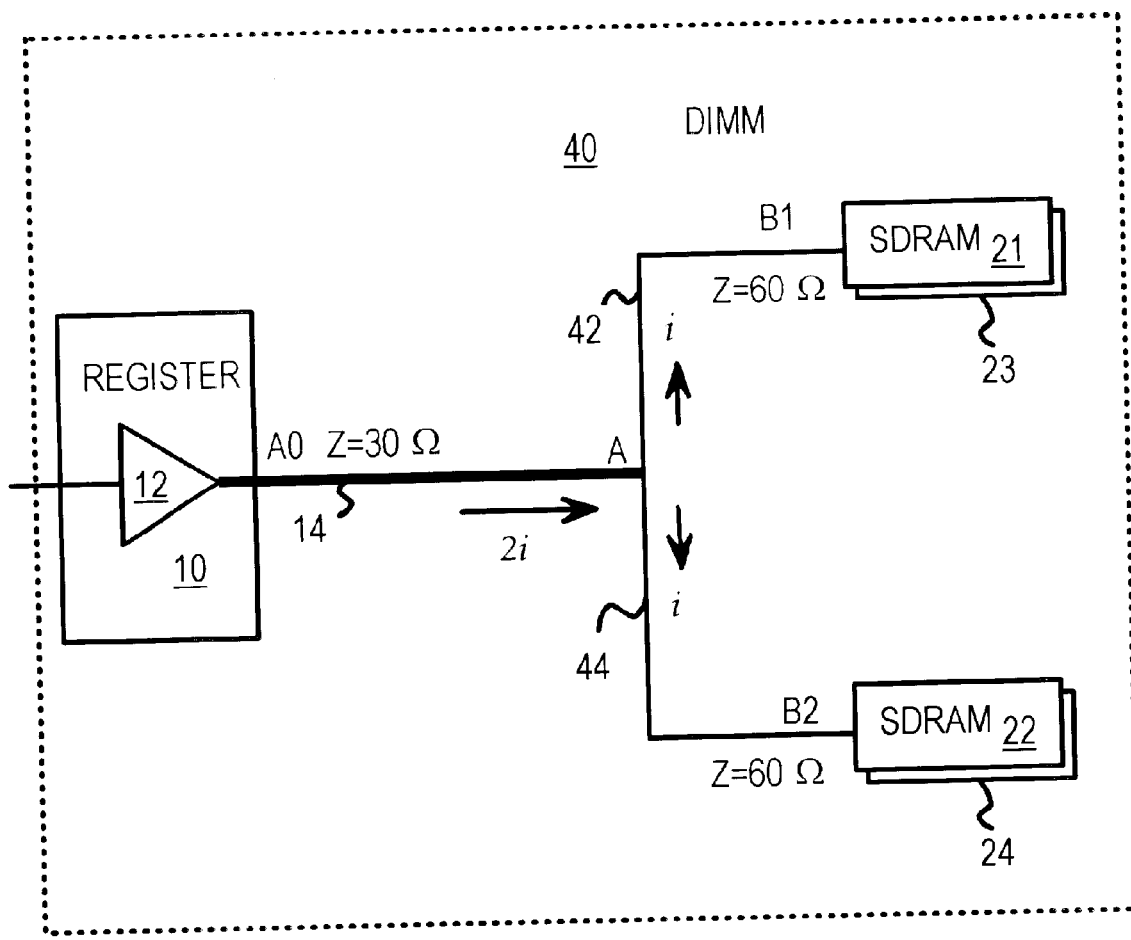
FIG. 6 shows a memory module with impedance matching for two branches that each drives a pair of DRAM chips.

FIG. 6 shows a memory module with impedance match-ing for two branches that each drive a pair of DRAM chips. Input line 14 from driver 12 has an impedance of 30 ohms and drives a 2i current to junction A on module 40. Junction A splits into two lines 42, 44, each receiving a current i and have an impedance of 60 ohms.

Rather than drive only one DRAM input, each branch line 42, 44 drives a pair of DRAM chips. The chips in a pair are near one another. For example, DRAM chips 21, 23 may be stacked, or may be opposite one another on different sur-faces of module 40. A via through the module substrate can connect the pair of DRAM chips 21, 23 with a very short connection. For stacked chips, the connection can be as short as a chip lead or a led on an adapter board between the stacked chips.

Since the connection between DRAM chips 21, 23 is so short, endpoint B1 can be treated as a single endpoint. Likewise, since connection between DRAM chips 22, 24 is so short, endpoint B2 can also be treated as a single endpoint. Although each of branch lines 42, 44 drive two DRAM loads, for impedance-matching each is treated as driving a single load rather than a double load. Thus junction A is impedance-matched as being a 2-way junction. The input impedance (30 ohms) is half of the impedance (60 ohms) of each branch line 42, 44.

Figure 7:
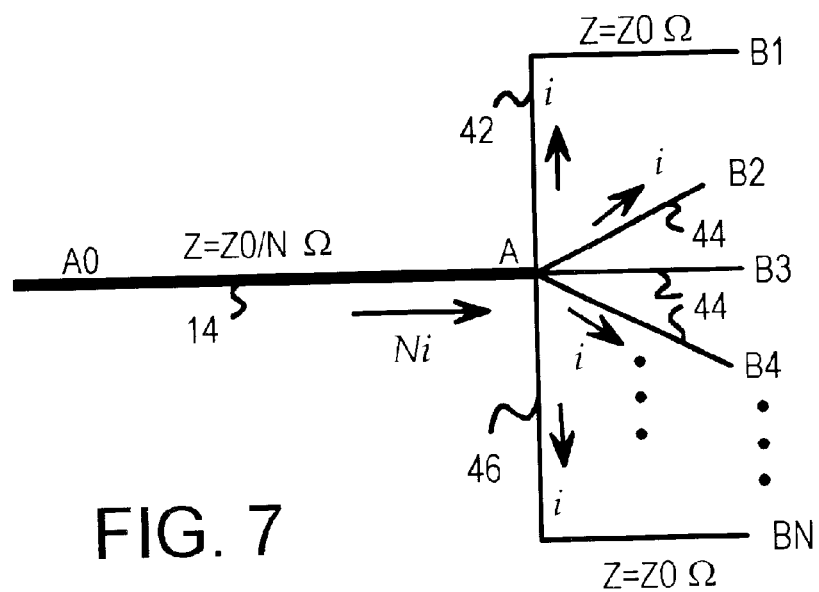
FIG. 7 shows in general how to impedance-match an N-way junction.

FIG. 7 shows in general how to impedance-match an N-way junction. Input line 14 drives a current to junction A, which splits into N lines 42, 44, 46 having the same impedance of Z0. The N lines 42, 44, 46 drive DRAM inputs at endpoints B1, B2, B3 . . . BN.

The input impedance of input line 14 is adjusted to 1/N of the branch-line impedance Z0. Thus the impedance of input line 14 is adjusted to Z0/N. Input line can have its width or thickness enlarged to reduce its impedance to Z0/N, such as by making input line Z0 N times wider than branch line 42. The current driven onto input line 14 is increased to N times the branch current, or N*i.

Thus for the generalized case of an N-way junction with N branch lines of impedance Z0, the input impedance of a junction is adjusted to be Z0/N.

Figure 8:
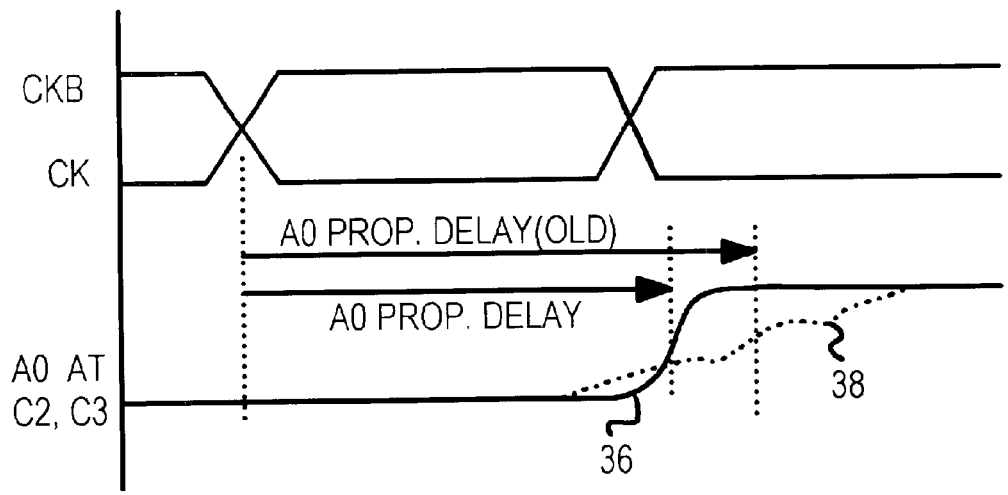
FIG. 8 is a waveform of a DRAM input driven by an impedance-matched line.

FIG. 8 is a waveform of a DRAM input driven by an impedance-matched line. Address line A0 switches after a delay from a cross-over point of a differential clock CK, CKB. The propagation delay from the clock cross-over to the input threshold voltage of the DRAM is reduced when impedance is adjusted to match at trace junctions, as shown for curve 36, compared with having all traces of the same impedance, as shown in curve 38. Reflections from imped-ance mis-matches at junctions are reduced or eliminated, eliminating knees in curve 38.

Impedance-Matching of Differential Clock Inputs

Figure 9:
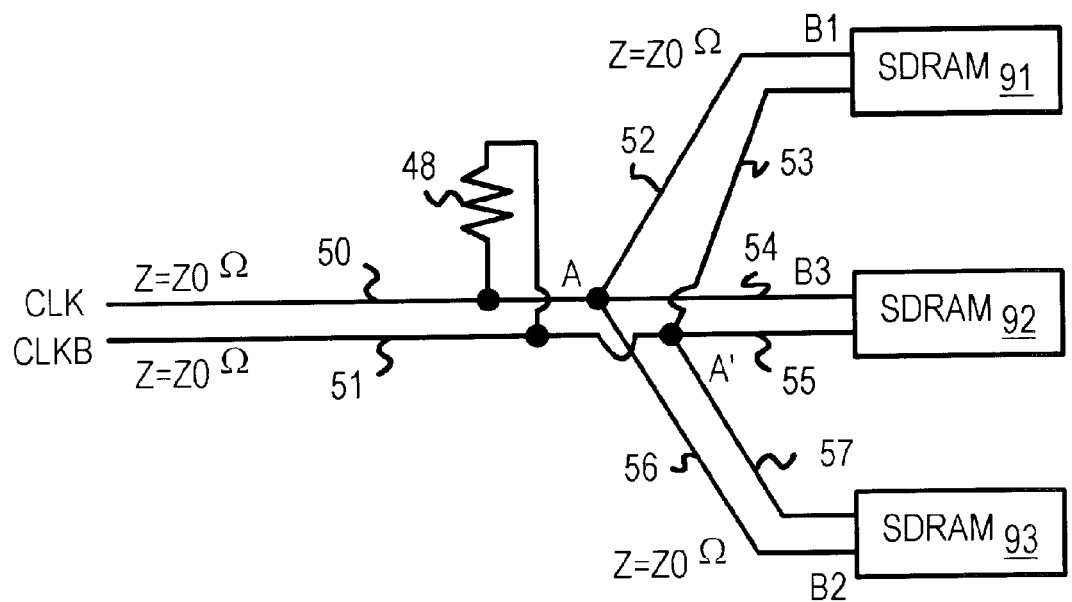
FIG. 9 is a diagram of termination of a differential clock line near a trace junction.

FIG. 9 is a diagram of termination of a differential clock line near a trace junction. A differential clock signal CLK, CLKB is driven onto differential input lines 50, 51. Input line 50 branches at junction A to branch lines 52, 54, 56 which driven CLK inputs of DRAM chips 91, 92, 93 at endpoints B1, B3, B2, respectively. Likewise, input line 51 branches at junction A' to branch lines 53, 55, 57 which driven CLKB inputs of DRAM chips 91, 92, 93, respec-tively.

Terminating resistor 48 may be added between input lines 50, 51 near junctions A, A' to provide termination of lines 50, 51.

Terminating resistor 48 is undesirable since cannot improve the waveform as significantly as impedance match-ing. Impedance matching at junctions A, A' can eliminate the reflections caused by impedance mis-match and reduce the need for terminating resistors.

Figure 10A:
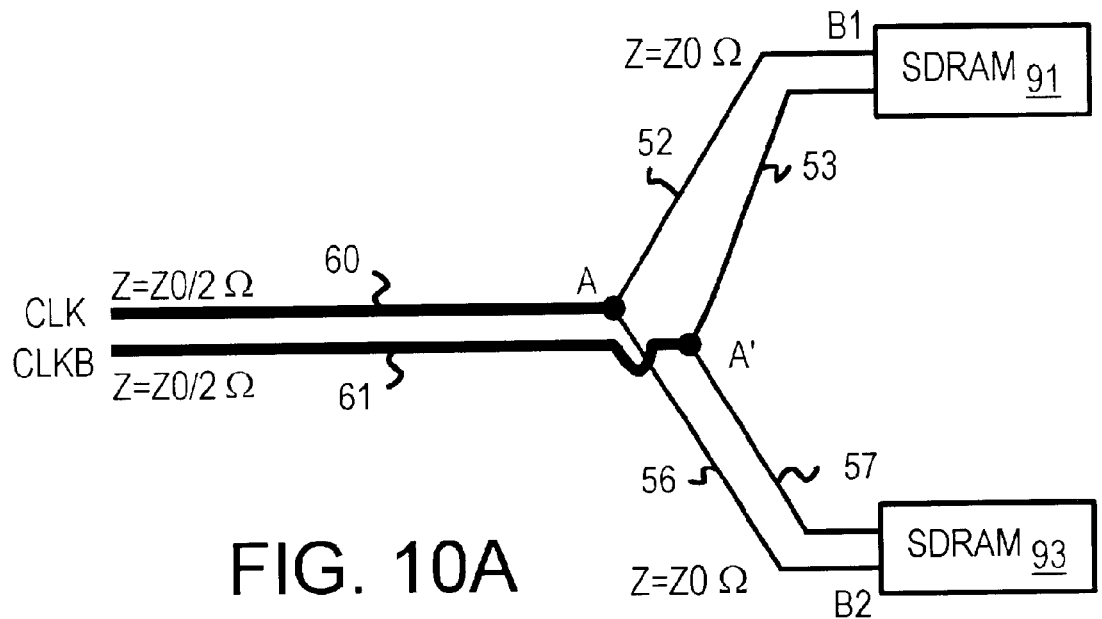
FIGS. 10A–K show a variety of differential-signal trace topologies with impedance-matching at junctions.

FIGS. 10A–K show a variety of differential-signal trace topologies with impedance-matching at junctions. In FIG. 10A, differential input lines 60, 61 can carry a differential clock CLK, CLKB, or could carry some other differential signal such as differential data. Two DRAMs chips 91, 93 are driven by the differential clock. At junction A, input line 60 splits into two branch lines 52, 56. Since the split parameter N is 2, the input impedance of input line 60 is Z0/N or Z0/2. For example, when branch lines 52, 56 have an impedance Z0 of 70 ohms, input line 60 has an impedance of 35 ohms.

Likewise, at junction A', input line 61 splits into two branch lines 53, 57. Since the split parameter N is 2, the input impedance of input line 61 is Z0/N or Z0/2. Differ-ential branch lines 52, 53 drive inputs of DRAM chip 91 at endpoints B1, while differential branch lines 56, 57 drive inputs of DRAM chip 93 at endpoints B2.

Figure 10B:
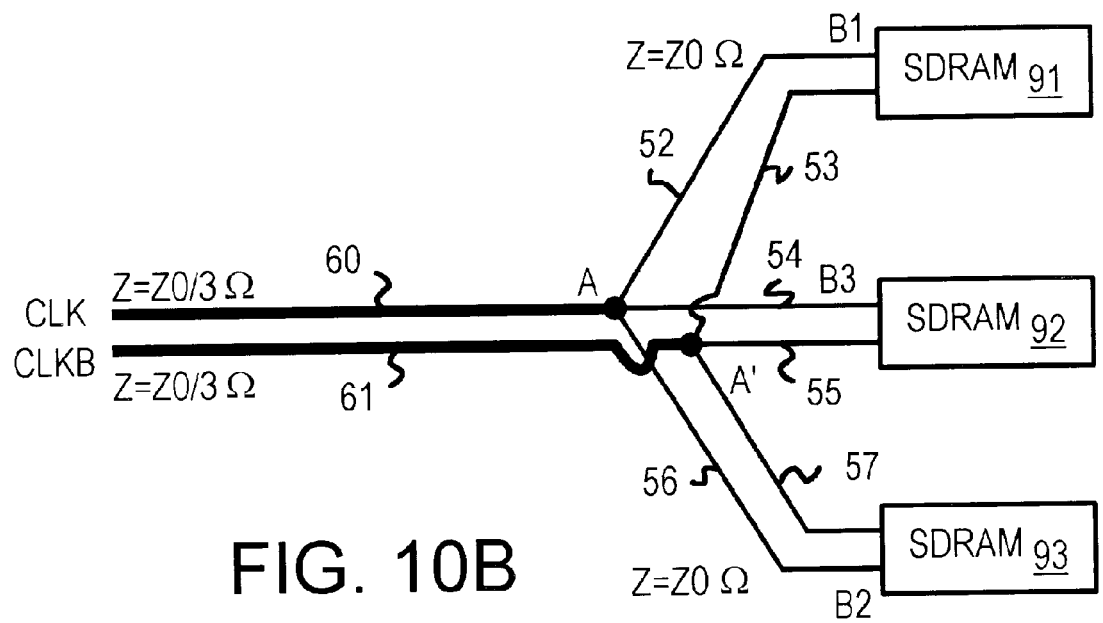

In FIG. 10B, differential input lines 60, 61 each split into three branches at junctions A, A'. Three DRAM chips 91, 92, 93 are driven by the differential clock. At junction A, input line 60 splits into three branch lines 52, 54, 56. Since the split parameter N is 3, the input impedance of input line 60 is Z0/N or Z0/3. For example, when branch lines 52, 54, 56 each have an impedance Z0 of about 75 ohms, input line 60 has an impedance of 25 ohms.

Likewise, at junction A', input line 61 splits into three branch lines 53, 55, 57. The input impedance of input line 61 is also Z0/N or Z0/3. Differential branch lines 52, 53 drive inputs of DRAM chip 91 at endpoints B1, differential branch lines 54, 55 drive inputs of DRAM chip 92 at endpoints B3, and differential branch lines 56, 57 drive inputs of DRAM chip 93 at endpoints B2.

Figure 10C:
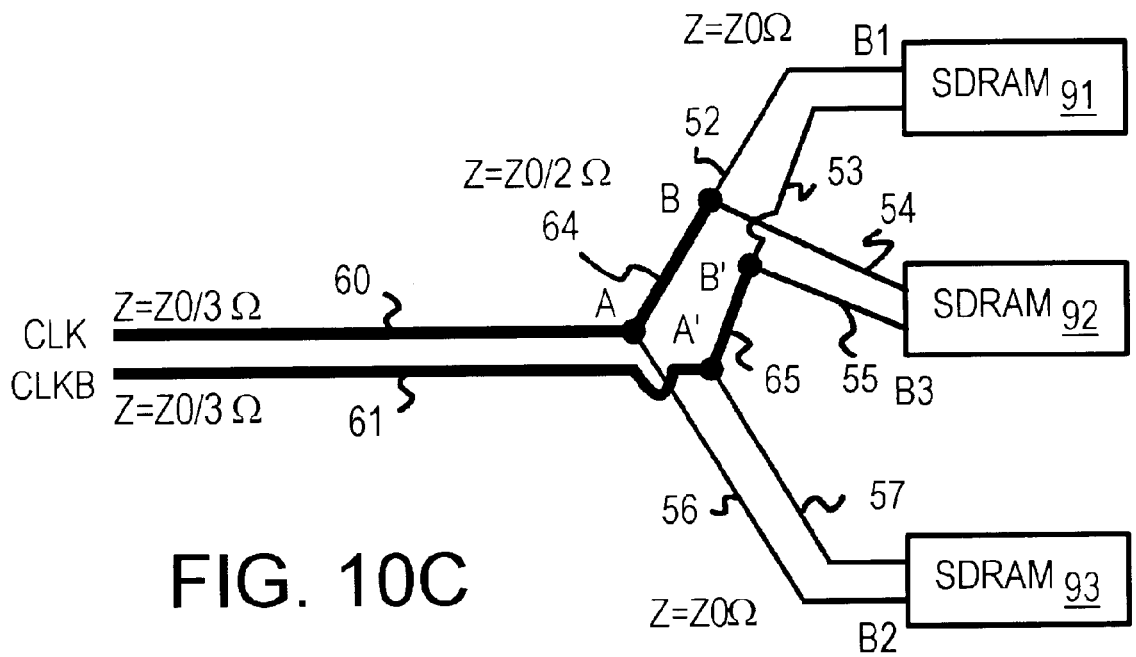

In FIG. 10C, three DRAMs are driven using only 2-way junctions. Secondary junctions B, B' occur between primary junctions A, A' and endpoints B1, B3. At secondary junction B, branch line 64 splits into two final branch lines 52, 54 to DRAM chips 91, 92, at endpoints B1, B3, respectively.

Since the final branch lines 52, 54 have the minimum trace width, each has an impedance of about Z0. At junction B, the split parameter N is 2, so the input impedance of branch line 64 is Z0/2. For example, when Z0 is 60 ohms, branch line 64 has an impedance of 30 ohms.

At primary junction A, input line 60 splits into two branches: branch line 64 to secondary junction B, and branch line 56 to endpoint B2 and DRAM chip 93. Although junction A is only a 2-way split, a modified equation is used to determine the input impedance, since branch line 64 has a lower impedance of Z0/2, while branch line 56 has an impedance of Z0.

The input impedance of input line 60 is $Z=1/[(1/Z1)+(1/Z2)]$ where Z1 is the impedance of branch line 64 and Z2 is the impedance of branch line 56. Substituting, $Z=1/[(2/Z0)+(1/Z0)]=1/[3/Z0]=Z0/3$. Input line 60 is thus adjusted to have an impedance of Z0/3, or a 20-ohm impedance when Z0 is 60 ohms. The complementary input line 61 and branch line 65 are also adjusted to 20 ohms and 30 ohms, respectively.

Figure 10D:
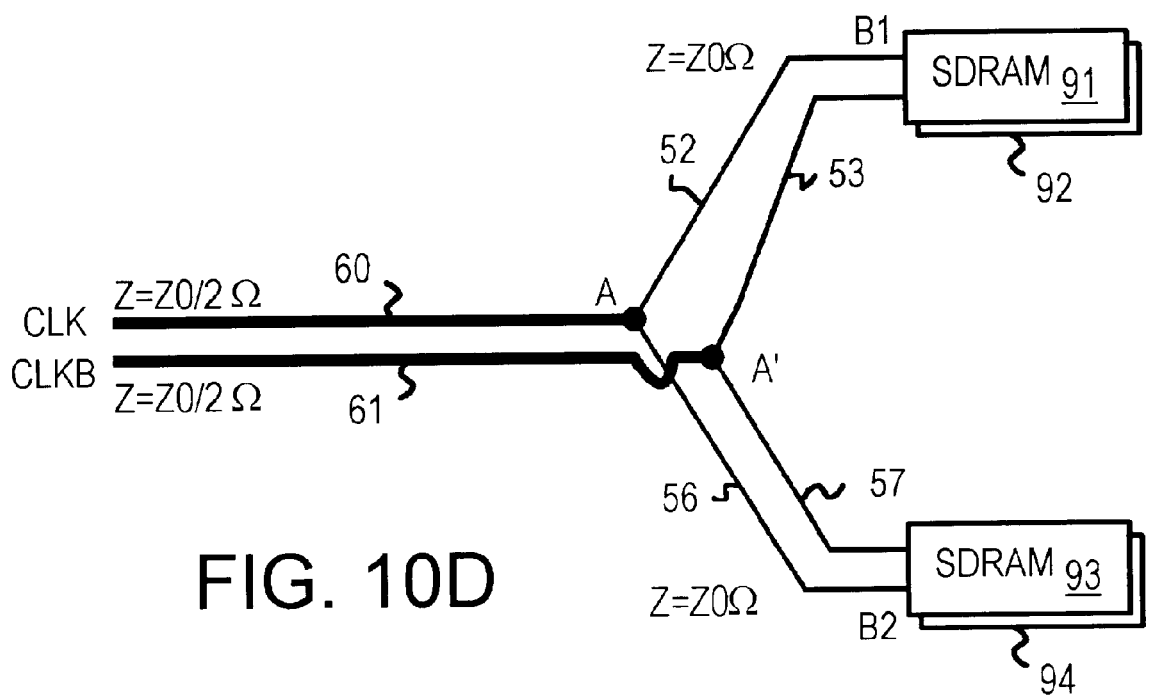

FIG. 10D shows two branches that each drive a pair of DRAM chips. DRAM chips 91, 92 are close to each other, such as by being mounted opposite each other on opposite surfaces of a PCB, or by being stacked. DRAM chips 91, 92 appear as a single load at endpoint B1 of branch line 52. Likewise, DRAM chips 93, 94 are so close to each other than they approximate a single load at endpoint B2 of branch line 56. Junctions A, A' are each 2-way splits, so input lines 60, 61 have impedances of Z0/2.

Figure 10E:
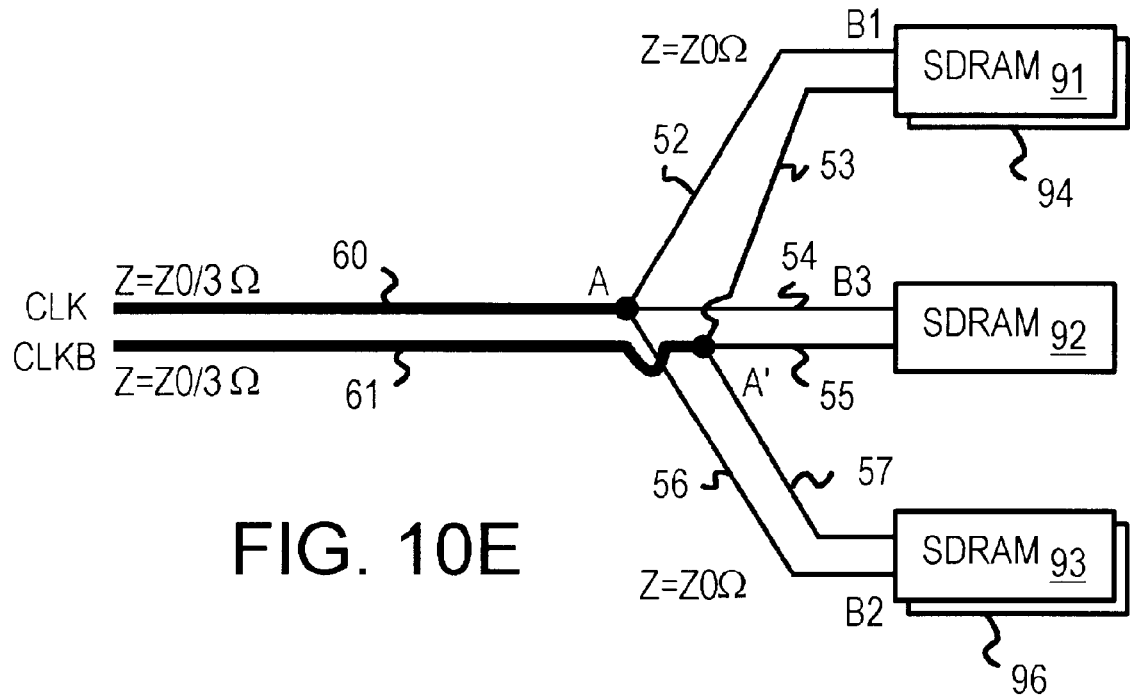

In FIG. 10E, some DRAM chips are paired while others are not paired. A total of five DRAM chips are mounted on the memory module. DRAM chips 91, 94 are paired and act as a single load at endpoints B1 of branch lines 52, 53. DRAM chips 93, 96 are also paired and act as a single load at endpoint B2 of branch lines 56, 57. However, only one DRAM chip 92 is at endpoint B3 of branch lines 54, 56.

All three branch lines 52, 54, 56 split from junction A, while all three branch lines 53, 55, 57 split from junction A'. Despite the differing number o DRAM chips at endpoints B1, B2, B3, the impedances of lines 52, 54, 56, 53, 55, 57 are roughly the same base impedance Z0. Thus for a N=3 split at junctions A, A', the input impedance for input lines 60, 61 is Z0/3.

Figure 10F:
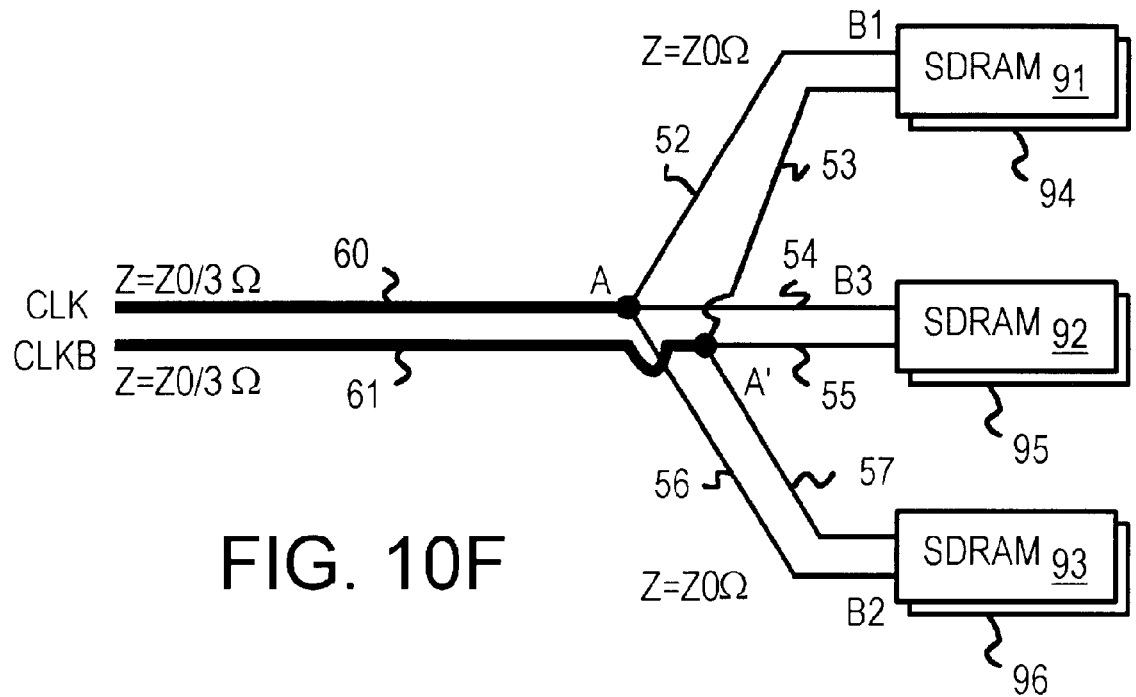

FIG. 10F shows a memory module with six DRAM chips. All DRAM chips are paired, so a three-way split occurs at each of junctions A, A'. The input impedances of input lines 60, 61 are thus Z0/3.

Figure 10G:
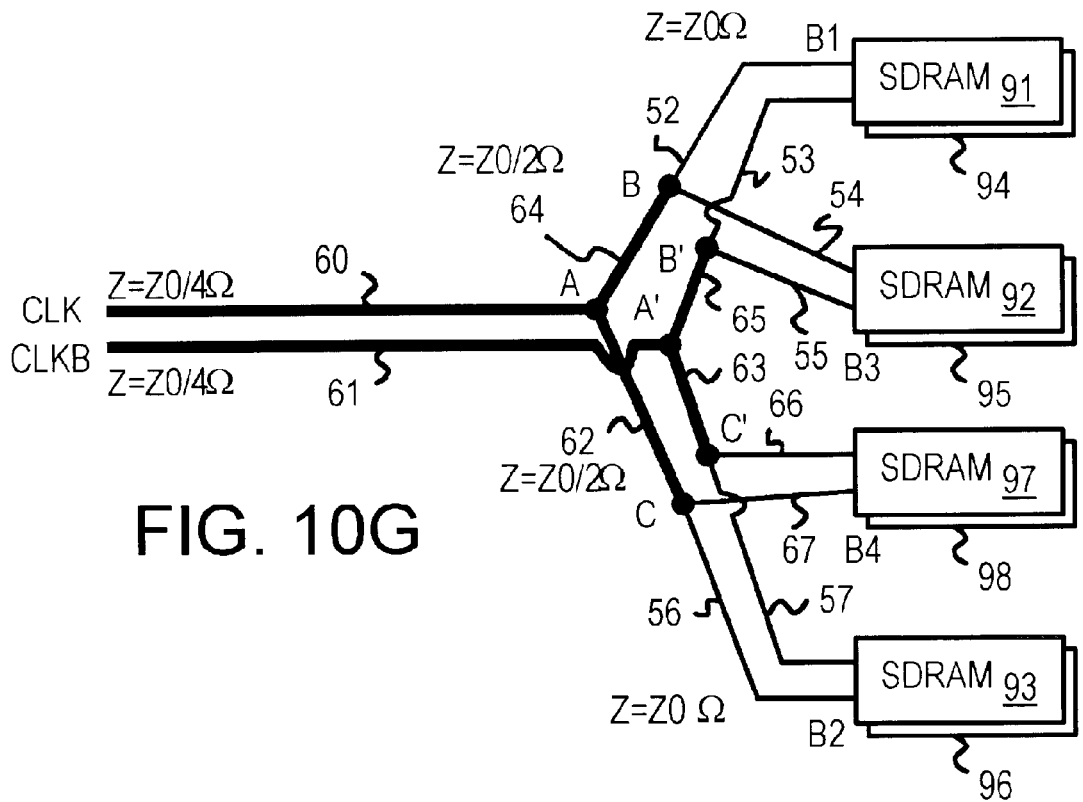

FIG. 10G shows 8 DRAM chips on a memory module with secondary junctions. DRAM chips 91—91 are paired and each pair acts as a single load. DRAM chips 91, 94 receive the differential clock at endpoint B1 of branch lines 52, 53. DRAM chips 93, 96 receive the differential clock at endpoint B2 of branch lines 56, 57. DRAM chips 92, 95 receive the differential clock at endpoint B3 of branch lines 54, 55, and DRAM chips 97, 98 receive the differential clock at endpoint B4 of branch lines 66, 67.

The primary input lines 60, 61 split off at junctions A, A' to middle branch lines 64, 65 to secondary junctions B, B', and to middle branch lines 62, 63 to secondary junctions C, C'. Middle branch lines 65, 65 split at secondary junctions B, B' to final branch lines 52, 53 to endpoint B1 and to final branch lines 54, 55 to endpoint B3. Middle branch lines 62, 63 split at secondary junctions C, C' split to final branch lines 56, 57 to endpoint B2 and to final branch lines 66, 67 to endpoint B4.

Since final branch lines each have impedance Z0, middle branch lines have an impedance of Z0/2, since secondary junctions B, B', C, C' each are 2-way splits with N=2. Primary input lines 60, 61 split 2 ways (N=2) at primary junctions A, A', but each branch from junctions A, A' has impedance Z0/2. Thus input lines 60, 61 have half the impedance of middle branch lines 62, 63, 64, 65, or Z0/4.

Figure 10H:
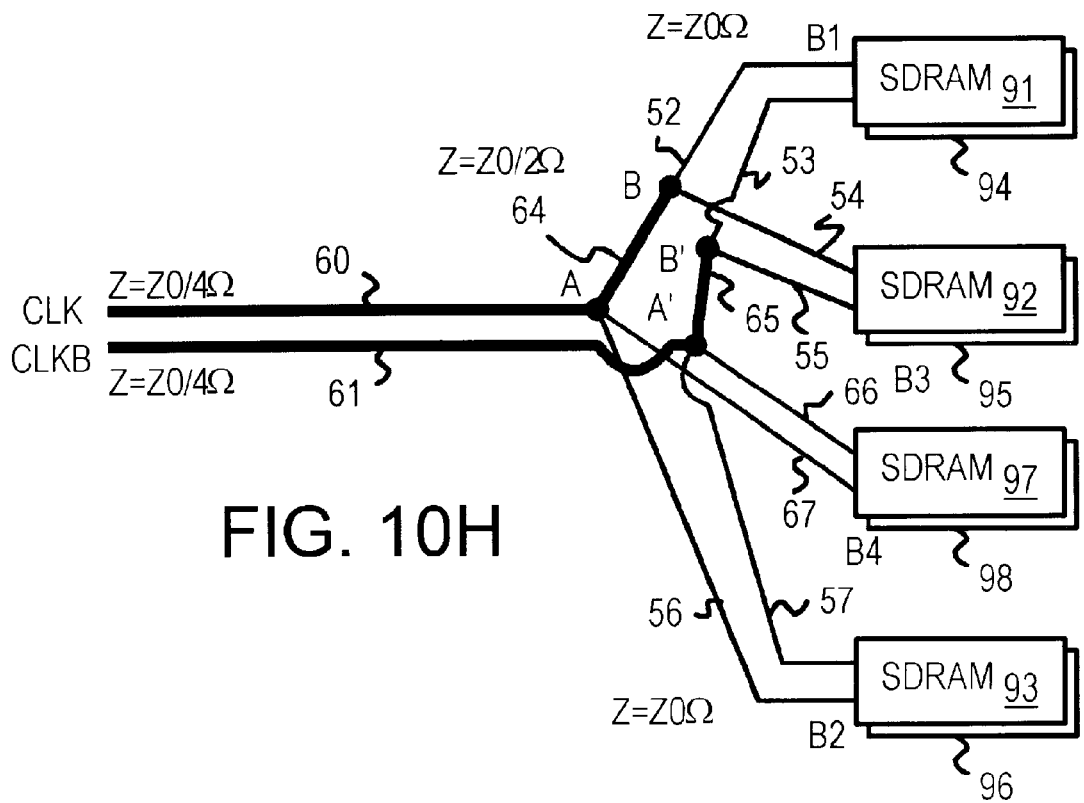

In FIG. 10H, primary junctions A, A' are 3-way splits, but one of the branches is a larger middle branch line. Middle branch lines 65, 65 have an impedance of Z0/2, since they split to two final branch lines (N=2) at secondary junctions B, B'.

Primary junction A drives two minimum-width final branch lines 56, 66, and one larger middle branch line 62. The input impedance of input line 60 is equal to the sum of the impedances of branches from junction A, or $Z=1/[1/Z(\text{line } 64)+1/Z(\text{line } 66)+1/Z(\text{line } 56)]=1/[1/(Z0/2)+1/Z0+1/Z0]=1/[4/Z0]=Z0/4$.

Figure 10I:
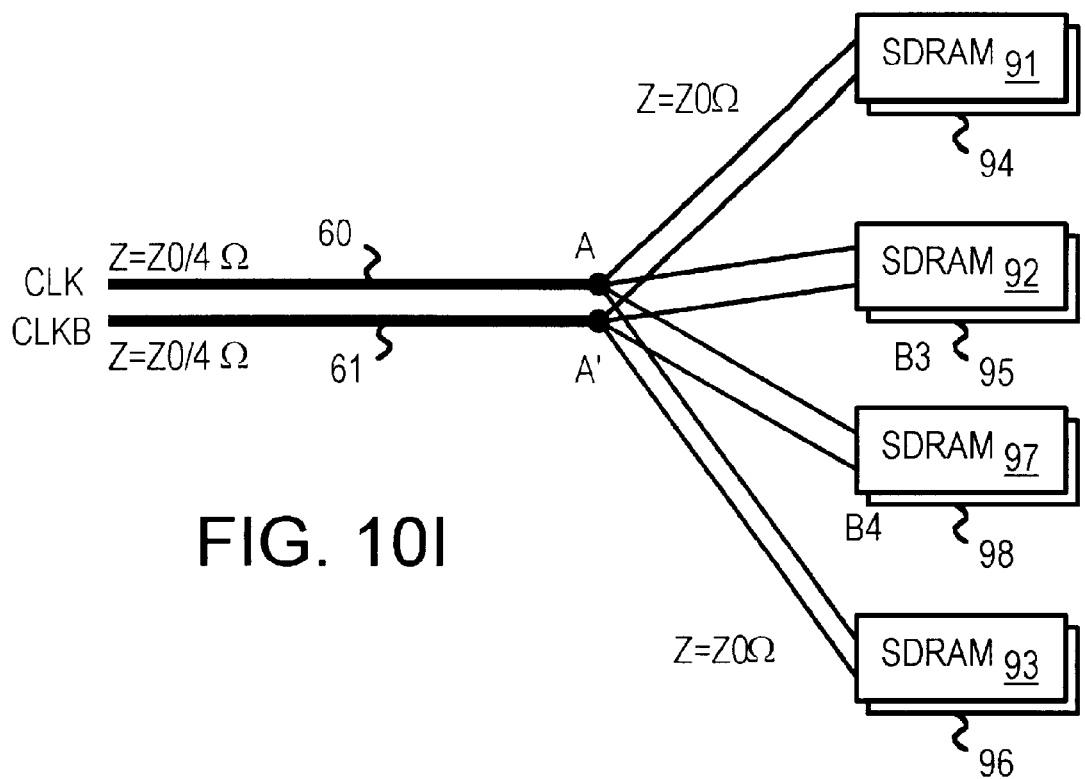

FIG. 10I shows a 4-way trace split. Differential input lines 60, 61 each split four ways at junctions A, A' to four branches to DRAM chips 91–98. Since N=4, the input impedance of lines 60, 61 is adjusted to Z0/4, when Z0 is the impedance of the branch lines from junctions A, A'.

Figure 10J:
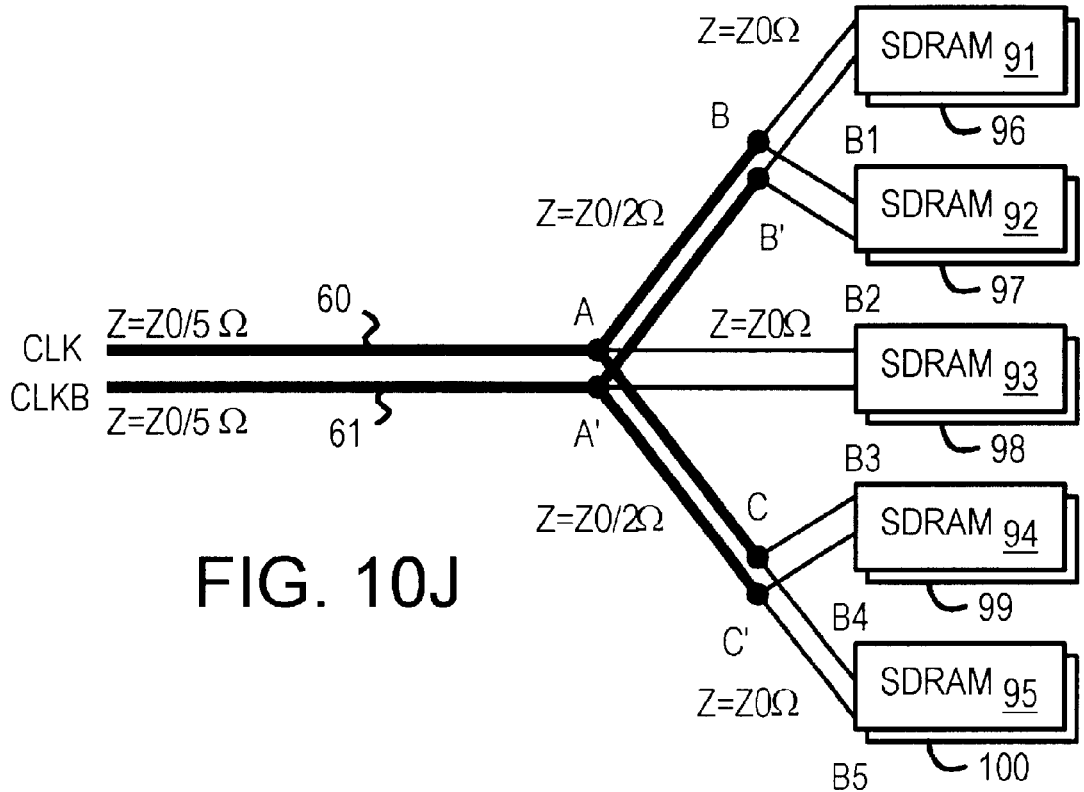

In FIG. 10J, a total of 10 DRAM chips 91–100 are driven from differential input lines 60, 61. The DRAM chips are paired for a total of 5 endpoints. Secondary junctions B, B', C, C' each drive two final branch lines of impedance Z0. Middle branch lines between junctions A and B, A and C, A' and B', and A' and C' each have an impedance of Z0/2.

Primary junction A splits into 3 branch lines. However, one branch line is a final branch line to DRAM chips 93, 98 and has an impedance of Z0, while the other two middle branch lines have impedances of Z0/2. The sum of the output impedances is $Z=1/[1/(Z0/2)+1/(Z0/2)+1/Z0]=1/[5/Z0]=Z0/5$. For example, when Z0 is 100 ohms, the middle branch lines have impedances of 50 ohms while primary input lines 60, 61 have impedances of 20 ohms.

Figure 10K:
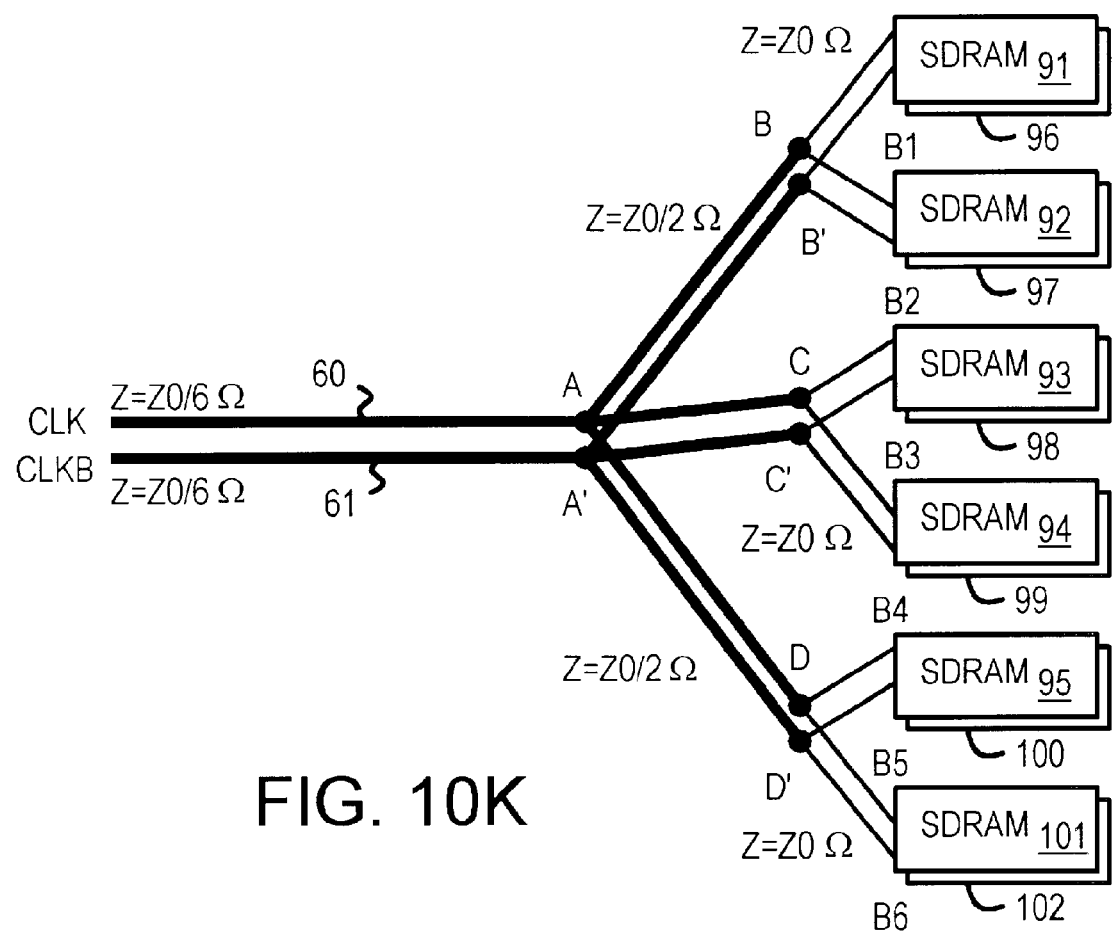

In FIG. 10K, a total of 12 DRAM chips 91–102 are driven from differential input lines 60, 61. The DRAM chips are paired for a total of 6 endpoints. Secondary junctions B, B', C, C', D, D' each drive two final branch lines of impedance Z0. Middle branch lines between junctions A and B, A and C, A and D, A' and B', A' and C', and A' and D' each have an impedance of Z0/2.

Primary junction A splits into 3 branch lines of equal impedance Z0/2. Thus the impedance of input lines 60, 61 is Z/3 or Z0/6, where Z is the middle branch impedance of Z0/2.

Alternate Embodiments

Several other embodiments are contemplated by the inventor. For example various other topologies may be substituted and many variations are possible. Ideally, the equivalent impedance of the branch lines from a junction is equal to the adjusted input impedance. However, the exact impedances of branch lines may not be known or may vary somewhat. The inventions is still useful when the adjusted input impedance is not exactly equal to the equivalent impedance of the branches, but is close to the equivalent impedance, such as being within 20% of the ideal. Such a closeness may be considered an impedance match, even though not exactly equal.

The trace impedance of final line segments may be increased, such as to 120 ohms, or decreased. The thickness of the input line or middle lines could be increased rather the width to reduce impedance, but this may be more complex to fabricate. More precise impedance matching can be done by more exact calculations or simulation of line geometries and chip input loads of actual memory module layouts. Measurements could be made of memory modules, or several prototype memory modules could be manufactured with slightly differing line widths and impedances and tested to determine empirically the best line widths for impedance matching.

Traces could be somewhat asymmetric. Different numbers of DRAM chips could be mounted on the module, such as 16 or 32 or 36 or some other number. DRAM chips may be mounted on both sides of the memory module, and additional distribution lines, vias, junctions may be used.

Buffers, latches, registers, or other devices could be added to the memory module. While the invention has been described with application to memory modules, other kinds of modules and boards could benefit from trace impedance matching, and the invention may be extended to these applications as well. Memory modules such as double-data-rate (DDR) or other formats may also be used.

Lines may be traces in a metal layer on one of the surfaces of the module substrate, or may be on a metal layer within the substrate, or may include a combination of layers including metalized vias connecting layers.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. sect. 1.72(b). Any advantages and benefits described may not apply to all embodiments of the invention. When the word "means" is recited in a claim element, Applicant intends for the claim element to fall under 35 USC sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A trace-impedance-matched board comprising:
    a substrate containing wiring traces that include an input trace ending at a first junction;
    a plurality of branch traces on the substrate, the plurality of branch traces branching from the first junction to a plurality of endpoints;
    wherein a first equivalent impedance is a reciprocal of a sum of reciprocals of branch impedances of branch traces branching from the first junction in the plurality of branch traces;
    wherein an input impedance of the input trace is adjusted to match the first equivalent impedance
    wherein a width of the input trace is matched to a sum of widths of branch traces branching from the first junction.

2. The trace-impedance-matched board of claim 1 wherein the input impedance is adjusted by enlarging a width of the input trace or a thickness of the input trace.

3. The trace-impedance-matched board of claim 1 wherein each branch trace in the plurality of branch traces has an impedance within 10 percent of a base impedance Z0;
    wherein the plurality of branch traces comprises N branch traces that branch form the first junction, wherein N is a whole number of at least two;
    wherein the input impedance is adjusted to be within 10 percent of Z0/N.

4. A trace-impedance-matched board comprising:
    a substrate containing wiring traces that include an input trace ending at a first junction;
    a plurality of branch traces on the substrate, the plurality of branch traces branching from the first junction to a plurality of endpoints;
    wherein a first equivalent impedance is a reciprocal of a sum of reciprocals of branch impedances of branch traces branching from the first junction in the plurality of branch traces;
    wherein an input impedance of the input trace is adjusted to match the first equivalent impedance;
    wherein the plurality of branch traces comprises N branch traces that branch form the first junction, wherein N is a whole number of at least two;
    wherein input impedance of the input trace is adjusted by enlarging a width of the input trace;
    wherein the input trace is N times wider than each of the branch traces in the plurality of branch traces.

5. The trace-impedance-matched board of claim 4 wherein the trace-impedance-matched board is a memory module that further comprises dynamic-random-access memory (DRAM) chips mounted on the substrate;
    wherein the plurality of branch traces have endpoints that are inputs to the DRAM chips.

6. The trace-impedance-matched board of claim 5 wherein the DRAM chips are mounted on a first surface and on a second surface of the substrate;
    wherein each branch trace drives an input of a first DRAM chip mounted on the first surface and also drives an input of a second DRAM chip mounted on the second surface,
    wherein the first DRAM chip and the second DRAM chip are mounted opposite each other with at least a partial overlap,
    whereby branch traces drive pairs of DRAM chips mounted on opposite surfaces of the substrate.

7. The trace-impedance-matched board of claim 6 wherein the input line is un-terminated and not connected to a termination resistor;
    wherein each branch trace in the plurality of branch traces is un-terminated and not connected to a termination resistor;
    whereby termination of the input line and branch traces is eliminated by trace-impedance-matching of the first junction.

8. A trace-impedance-matched board comprising:
a substrate containing wiring traces that include an input trace ending at a first junction;
a plurality of branch traces on the substrate, the plurality of branch traces branching from the first junction to a plurality of endpoints;
wherein a first equivalent impedance is a reciprocal of a sum of reciprocals of branch impedances of branch traces branching from the first junction in the plurality of branch traces;
wherein an input impedance of the input trace is adjusted to match the first equivalent impedance
a trunk branch trace branching from the first junction;
a second junction, receiving a signal driven from the input trace, through the first junction to the trunk branch trace; and
a plurality of secondary branch traces that branch from the second junction;
wherein the second junction outputs a signal to the plurality of secondary branch traces;
wherein a second equivalent impedance is a reciprocal of a sum of reciprocals of second branch impedances of secondary branch traces that branch from the second junction in the plurality of secondary branch traces;
wherein a trunk impedance of the trunk branch trace is adjusted to match the second equivalent impedance.

9. A trace-impedance-matched board comprising:
a substrate containing wiring traces that include an input trace ending at a first junction;
a plurality of branch traces on the substrate, the plurality of branch traces branching from the first junction to a plurality of endpoints;
wherein a first equivalent impedance is a reciprocal of a sum of reciprocals of branch impedances of branch traces branching from the first junction in the plurality of branch traces;
wherein an input impedance of the input trace is adjusted to match the first equivalent impedance;
wherein the input trace carries a true signal of a differential signal;
a complement input trace ending at a complement junction, the complement input trace carrying a complement signal of the differential signal;
a plurality of complement branch traces on the substrate, the plurality of complement branch traces branching from the complement junction to a plurality of complement endpoints;
wherein a first complement equivalent impedance is a reciprocal of a sum of reciprocals of complement branch impedances of complement branch traces branching from the complement junction in the plurality of complement branch traces;
wherein a complement input impedance of the complement input trace is adjusted to match the first complement equivalent impedance,
whereby the differential signal is carried by a pair of impedance-matched traces.

10. An impedance-matched module comprising:
a substrate having chips mounted thereon;
a plurality of wiring traces formed within or on the substrate;
an input line in the plurality of wiring traces;
a first branch line in the plurality of wiring traces;
a second branch line in the plurality of wiring traces;
a third branch line in the plurality of wiring traces;
a primary junction connecting an end of the input line to the first branch line, the second branch line, and to the third branch line;
wherein a first equivalent impedance is a parallel combination of impedances of branches from the primary junction including a first impedance of the first branch line, a second impedance of the second branch line, and a third impedance of the third branch line;
wherein the input line has an input impedance that is matched to the first equivalent impedance by widening or thickening the input line.

11. The impedance-matched module of claim 10 wherein the first branch line drives an input of a first chip mounted on the substrate;
wherein the second branch line drives an input of a second chip mounted on the substrate;
wherein the third branch line drives an input of a third chip mounted on the substrate.

12. The impedance-matched module of claim 10 wherein the input line, and the first, second, and third branch lines are not connected to terminating resistors.

13. The impedance-matched module of claim 12 wherein the input line has the input impedance that is matched to within 20-percent of the first equivalent impedance.

14. The impedance-matched module of claim 13 further comprising:
a complement input line in the plurality of wiring traces;
a complement first branch line in the plurality of wiring traces;
a complement second branch line in the plurality of wiring traces;
a complement third branch line in the plurality of wiring traces;
a complement primary junction connecting an end of the complement input line to the complement first branch line, the complement second branch line, and to the complement third branch line;
wherein a second equivalent impedance is a parallel combination of impedances of branches from the complement primary junction including a fourth impedance of the complement first branch line, a fifth impedance of the complement second branch line, and a sixth impedance of the complement third branch line;
wherein the complement input line has an impedance that is matched to the second equivalent impedance by widening or thickening the complement input line;
wherein the input line and the complement input line receives a differential signal.

15. The impedance-matched module of claim 14 wherein input line and the complement input line receive a differential clock to the chips mounted on the substrate.

16. A module with impedance-matched trace junctions comprising:
substrate means for supporting chips driven by wiring traces formed on the substrate means;
input interconnect means for transmitting a signal along a wiring trace to a first junction;
first branch interconnect means for connecting the signal to a first chip on the substrate means;
second branch interconnect means for connecting the signal to a second chip on the substrate means; and
first junction means, receiving the signal from the input interconnect means, for connecting the signal to the first branch interconnect means and to the second branch interconnect means, the first junction means being a junction of the wiring traces;

wherein a width of the input interconnect means is matched to a sum of widths of branch traces driven from the first junction means, including a first width of the first branch interconnect means and a second width of second branch interconnect means;

wherein an input impedance of the input interconnect means matches an equivalent impedance of branch traces driven from the first junction means, including the first and second branch interconnect means, whereby impedance is matched at the first junction means.

17. The module with impedance-matched trace junctions of claim 16 wherein the input impedance is matched to within 20-percent of the equivalent impedance.

18. A module with impedance-matched trace junctions comprising:

substrate means for supporting chips driven by wiring traces formed on the substrate means;

input interconnect means for transmitting a signal along a wiring trace to a first junction;

first branch interconnect means for connecting the signal to a first chip on the substrate means;

second branch interconnect means for connecting the signal to a second chip on the substrate means;

first junction means, receiving the signal from the input interconnect means, for connecting the signal to the first branch interconnect means and to the second branch interconnect means, the first junction means being a junction of the wiring traces;

wherein an input impedance of the input interconnect means matches an equivalent impedance of branch traces driven from the first junction means, including the first and second branch interconnect means;

first trunk interconnect means for further distributing the signal from the first junction means, the first trunk interconnect means being a branch trace from the first junction means;

third branch interconnect means for connecting the signal to a third chip on the substrate means;

fourth branch interconnect means for connecting the signal to a fourth chip on the substrate means; and second junction means, receiving the signal from the first trunk interconnect means, for connecting the signal to the third branch interconnect means and to the fourth branch interconnect means, the second junction means being another junction of the wiring traces;

wherein a trunk impedance of the first trunk interconnect means matches a secondary equivalent impedance of secondary branch traces driven from the second junction means, including the third and fourth branch interconnect means, whereby impedance is matched at the first and second junction means.

\* \* \* \* \*